United States Patent [19]
Ljungberg et al.

[11] Patent Number: 5,859,880
[45] Date of Patent: Jan. 12, 1999

[54] MULTI-STAGE SQUELCH APPARATUS, AND ASSOCIATED METHOD, FOR A MULTI-BRANCH RECEIVER

[75] Inventors: Bengt Ljungberg, Kista; Linus Ericsson, Täby; Johan Andersson, Lidingö; Thomas Claesson, Sundbyberg, all of Sweden; Jan Lindh, East Brunswick, Australia

[73] Assignee: Telefonaktiebolaget LM Ericsson (publ), Stockholm, Sweden

[21] Appl. No.: 742,942

[22] Filed: Oct. 31, 1996

[51] Int. Cl.⁶ .................................. H04L 1/02; H04B 7/02
[52] U.S. Cl. .......................... 375/349; 375/351; 455/133; 455/137; 455/225; 455/303
[58] Field of Search ...................... 375/347, 349, 375/351; 455/133, 134, 135, 137, 140, 225, 303

[56] References Cited

U.S. PATENT DOCUMENTS

| | | |
|---|---|---|
| 2,514,162 | 7/1950 | Peterson .................................. 455/134 |
| 2,515,668 | 7/1950 | Schock et al. ........................... 375/267 |
| 4,317,229 | 2/1982 | Craig et al. ............................ 455/277.1 |
| 4,471,785 | 9/1984 | Wilson et al. ........................... 600/457 |
| 5,203,027 | 4/1993 | Nounin et al. ........................... 455/134 |
| 5,414,711 | 5/1995 | Okada et al. ............................. 371/5.1 |
| 5,539,781 | 7/1996 | Matsuura ................................. 375/347 |

FOREIGN PATENT DOCUMENTS

| | | |
|---|---|---|
| 0637878 | 2/1995 | European Pat. Off. . |
| 9606487 | 2/1996 | WIPO .............................. H04B 7/26 |
| 9624988 | 8/1996 | WIPO .............................. H04B 1/707 |

*Primary Examiner*—Stephen Chin
*Assistant Examiner*—Jeffrey W. Gluck
*Attorney, Agent, or Firm*—Jenkens & Gilchrist, P.C.

[57] ABSTRACT

Apparatus, and an associated method, for a multi-branch receiver. A receive signal is received at various receiver branches of the multi-branch receiver. Subsequent to selected processing stages of processing of the receive signal, determinations are made of the signal quality of the signal in the receiver branches. When determinations are made that the signal quality of the signal of a particular receiver branch is of poor quality, further processing of the signal in the branch is squelched.

31 Claims, 3 Drawing Sheets

MULTI-STAGE SQUELCH APPARATUS, AND ASSOCIATED METHOD, FOR A MULTI-BRANCH RECEIVER

The present invention relates generally to a multi-branch receiver having multiple receiver branches for receiving and processing a receive signal. More particularly, the present invention relates to a multi-stage squelch apparatus, and an associated method, for use with a multibranch receiver.

Processing of the receive signal received at different ones of the branches of the multi-branch receiver is selectively squelched at selected processing stages. The number of receiver branches in which subsequent receiver-stage processing is performed on the receive signal is gradually reduced. Thereby, gradual squelching of the receive signal occurs. Such gradual squelching of further processing of the receive signal received at the different ones of the receiver branches reduces the processing required to be performed by the multi-branch receiver.

BACKGROUND OF THE INVENTION

A multi-branch receiver is sometimes utilized in radio communication systems to receive a receive signal. A multi-branch receiver includes a plurality of receiver branches. Each receiver branch of the multi-branch receiver includes circuitry, or other functionality, of at least significant portions of a radio receiver. The receiver branches are coupled to a signal combiner. The signal combiner selectively combines together the receive signal received at selected ones of the receiver branches.

Improved reception of the receive signal is permitted by appropriate combination of the receive signal received at one or more of the receiver branches. For instance, the receive signal received at certain of the various receiver branches might, for instance, possess better signal characteristics than the receive signal received at certain others of the receiver branches. Selective combination of the receive signal received at the receiver branches exhibiting good quality permits a combined signal to be formed.

As signal characteristics of the receive signal change at the various receiver branches, the receiver branches selected from which to combine the receive signal can be changed, as appropriate.

The multi-branch receiver is advantageously utilized in a fixed-infrastructure such as a base station of a cellular communication system. When forming the portion of a cellular base station, an uplink signal transmitted to the base station by a mobile terminal forms the receive signal received at various branches of the multi-branch receiver.

An antenna matrix, such as a Butler matrix, for instance, can be used in conjunction with the multi-branch receiver. Different ones of the receiver branches are connected to the antenna matrix.

The receiver having two or more separate branches can sometimes provide improved receiver performance. The receive signal received at different ones of the receiver branches does not necessarily possess identical characteristics. The receive signal received at one receiver branch might exhibit better characteristics than the receive signal received at another receiver branch. The signal characteristics of the receive signals received at the various receiver branches might change over time. By selectively combining the receive signal received at various ones of the receiver branches, the resultant signal sometimes permits a more accurate re-creation of the signal transmitted to the receiver.

Different antenna patterns formed by different configurations of the antenna matrix cause the receive signals applied to the different receiver branches to be of different characteristics. The signal characteristics of the receive signal received at certain of the receiver branches are likely to be better than the signal characteristics of the receive signal received at others of the receiver branches. As the mobile terminal moves throughout an area encompassed by the cellular base station, uplink signals transmitted by the mobile terminal unit form the receive signal which is received at different signal strengths, and other signal qualities, at different ones of the receiver branches.

While use of the multi-branch receiver improves the possibility of accurately re-creating the uplink signal transmitted thereto, the receive signal received at each receiver branch must be separately processed. Substantial amounts of processing are required to process the receive signal in each receiver branch. The processing power required of the multi-branch receiver can become quite significant, particularly when the number of branches of which the multi-branch receiver is formed is large. Such processing power requires the allocation of significant resources to process the separate signals and to selectively combine signals from various ones of the receiver branches.

A manner by which the processing required of the multi-branch receiver can be reduced while maintaining the improved receiver operation permitted of the multi-branch receiver would be advantageous.

It is in light of this background information relating to multi-branch receivers that the significant improvements of the present invention have evolved.

SUMMARY OF THE INVENTION

The present invention, accordingly, advantageously provides a multi-stage squelch apparatus, and an associated method, for use with a multi-branch receiver. Operation of an embodiment of the present invention reduces the amounts of processing required to process the receive signal received at a multi-branch receiver.

Further processing of the receive signal received at selected receiver branches is selectively squelched. Signal-quality determinations are made subsequent to selected receiver processing stages at selected ones of the receiver branches. If the receive signal received in the receiver branch is determined to be of poor quality, further processing of the receive signal in that branch is squelched.

Additional signal-quality determinations are made subsequent to successive stages of processing of the various receiver branches. Responsive to such determinations, decisions are made to squelch further processing of the receive signal received in additional ones of the receiver branches. The number of receiver branches in which the receive signal is processed at successive receiver processing stages is successively, and gradually, reduced. Because of such reduction, the processing power required to operate the multi-branch receiver is reduced.

In one aspect of the present invention, a cellular base station includes a multi-branch receiver for receiving uplink signals transmitted thereto by a mobile terminal. An adaptive antenna, such as an antenna including a Butler matrix, is coupled by way of a multiplexer, or the like, to the different receiver branches of the multi-branch receiver. Sequences of the receive signal applied to the different receiver branches undergo various stages of signal processing. Determinations are made subsequent to selected signal processing stages of the quality of the receive signal received at respective ones of the receiver branches. If a determination is made that the receive signal is of poor quality, further processing of the receive signal in that receiver branch is squelched. Squelching of further processing of selected ones of the remaining receiver branches occurs after successive stages of signal processing in remaining ones of the receiver branches. Gradual squelching of the receive signal is thereby effectuated. Because further processing of the receive signal is gradually squelched, after different processing stages of different ones of the receiver branches, the amount of processing required to process the receive signal at the multi-branch receiver is reduced.

In another aspect of the present invention, an indoor, cordless telephone system includes a multi-branch receiver for receiving uplink signals transmitted thereto by mobile terminals. Distributed elements of an antenna device are coupled to the different receiver branches of the multi-branch receiver. Sequences of the receive signal applied to the different receiver branches undergo various stages of signal processing. Determinations are made subsequent to selected signal processing stages of the quality of the receive signal received at respective ones of the receiver branches. If a determination is made that the receive signal is of poor quality, further processing of the receive signal in that receiver branch is squelched. Squelching of further processing of selected ones of the remaining receiver branches occurs after successive stages of signal processing in such branches. Gradual squelching of the receive signal in the various branches is thereby effectuated. Because further processing of the receive signal is gradually squelched, after different processing stages of different ones of the receiver branches, the amount of processing required to process the receive signal at the multi-branch receiver is reduced.

In these and other aspects, therefore, an apparatus and an associated method are provided that selectively squelches processing of signals at selected stages of selected ones of a plurality of receiver branches within a multi-branch receiver device. Each receiver branch of the receiver device receives the receive signal and each receiver branch has a first receiver stage, a second receiver stage, and at least a third receiver stage. A first squelch element is positioned between the first receiver stage and the second receiver stage of at least selected ones of the receiver branches. Each of the first squelch elements, when actuated, squelches processing of the receive signal beyond the first receiver stage of the receiver branch at which the first squelch element is positioned. A second squelch element is positioned between the second receiver stage and the at least third receiver stage of at least selected ones of the receiver branches. Each of the at least second squelch elements, when actuated, squelches processing of the receive signal beyond the second receiver stage of the receiver branch at which the second squelch element is positioned. A controller is coupled to the first squelch elements, to the at least second squelch elements, and to receive at least indications of operation of the first and second receiver stages, respectively, of the receiver branches. The controller selectively actuates the first squelch elements and the second squelch elements responsive to reception of the at least indications of the operation of the first and second receiver stages.

A more complete appreciation of the present invention and the scope thereof can be obtained from the accompanying drawings which are briefly summarized below, the following detailed description of the presently preferred embodiments of the invention, and the appended claims.

DETAILED DESCRIPTION OF THE PRESENT INVENTION

Figure 1:
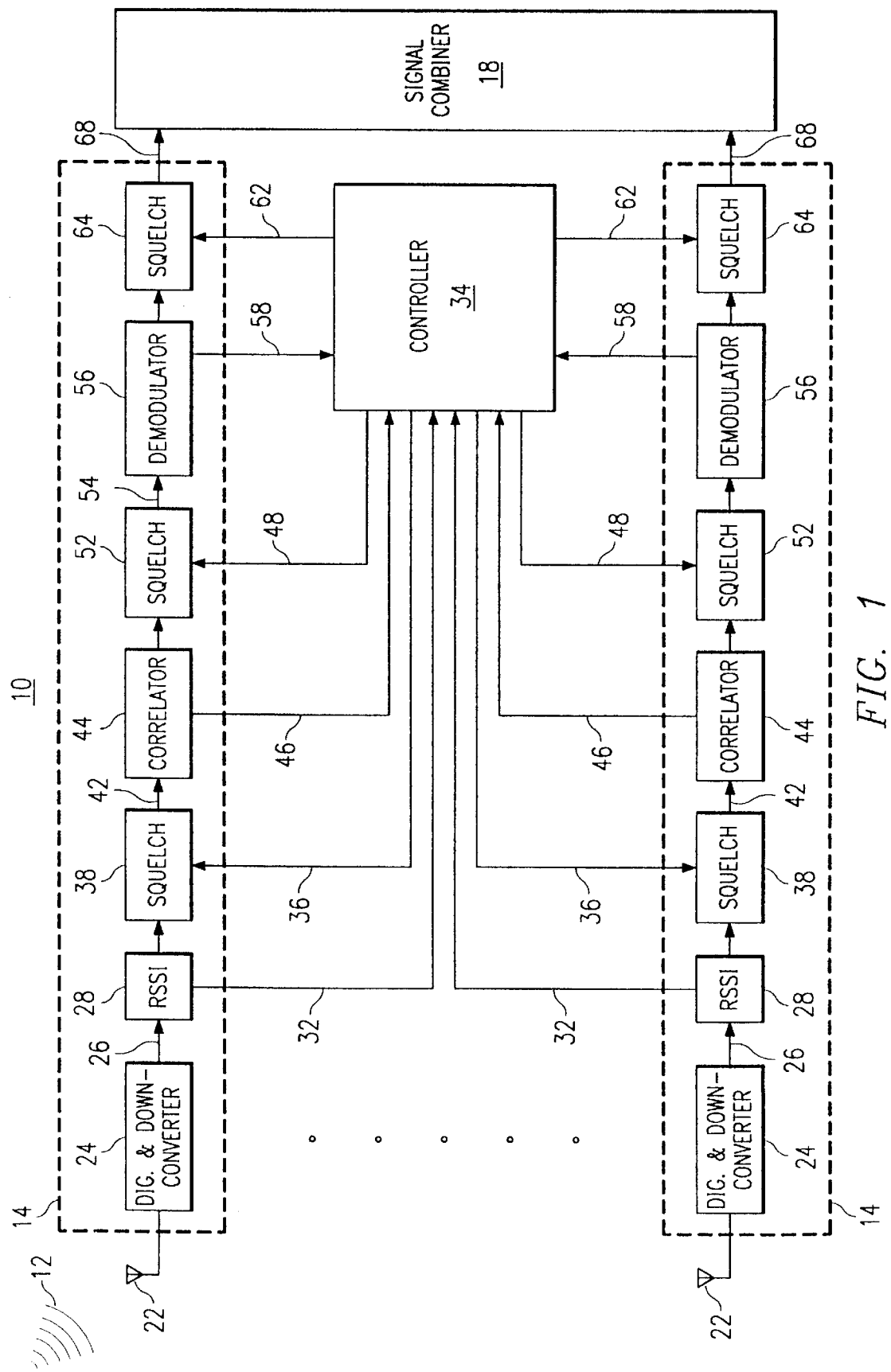
FIG. 1 illustrates a functional block diagram of a multi-branch receiver which includes an embodiment of the present invention as a portion thereof.

Referring first to FIG. 1, a multi-branch receiver, shown generally at 10, in which an embodiment of the present invention is operable, is shown. The receiver 10 is here operable to receive a receive signal 12 transmitted to the receiver 10 by a remotely-positioned transmitter (not shown). The receiver 10 includes a plurality of m receiver branches 14, of which two are illustrated in the figure.

Each of the m receiver branches 14 includes circuitry, or provides other functionality, to permit re-creation of the informational content of the signal actually transmitted by the remotely-positioned transmitter. Each of the receiver branches 14 is selectively coupled to a signal combiner 18.

The signal combiner 18 is operable to combine the signals processed in selected ones of the receiver branches 14. Appropriate combination of the receive signal 12 received at selected ones of the receiver branches 14 permits a combined signal to be formed which better permits the informational content of the signal transmitted by the remotely positioned transmitter to be re-created.

Operation of an embodiment of the present invention facilitates operation of the multi-branch receiver 10. Signal-quality determinations are made of the receive signal 12 received in the various receiver branches 14 during their processing. When a determination is made that the receive signal 12 received in a particular receiver branch 14 is of poor signal quality, further processing of the receive signal in that receiver branch is squelched. Processing of the receive signal 12 at all of the stages of each of the receiver branches 14 is not required. If a determination is made after an early processing stage of the receiver branch 14 that the signal-quality of the receive signal 12 received thereat is of poor quality, further signal processing of the receive signal in that branch is squelched.

Each receiver branch 14 includes a transducer 22 for converting the receive signal 12 from electromagnetic energy-form into electrical energy. The transducers 22 are each coupled to digitizers and down-converters 24, operable in conventional manner to digitize and down-convert the signals applied thereto by the transducers 22.

In the illustrated embodiment, down-converted signals formed by the converters 24 are applied by way of lines 26 to signal strength detectors 28. The signal strength detectors 28 detect, or otherwise measure, the signal strengths of the signals applied thereto. Indications of the detected, or otherwise measured, signal strengths are applied by way of lines 32 to a controller 34.

The controller 34 is operable to compare the signal strengths of the receive signals 12 received by each of the receiver branches 14 and to selectively squelch further processing of the receive signal in selected ones of the receiver branches. In one embodiment, the controller 34 compares the values of the indications of the signal strengths applied thereto by way of lines 32 and squelches further processing of the receive signal 12 in a selected n number of receiver branches 14 having the lowest signal strength values. Thereby, further processing of the receive signal 12 occurs in only a selected subset, formed of (m-n) receiver branches 14.

The controller 34 generates signals on lines 36 which, when applied to squelch elements 38 squelch further processing of the receive signal in the selected branches. In another embodiment, the controller 34 squelches further processing of the receive signal 12 in branches 14 in which the signal strengths of the receive signal are less than a selected threshold level.

Further processing of the receive signal 12 occurs in the subset of (m-n) subset of receiver branches 14. In the exemplary embodiment, the receive signal 12 is applied by way of lines 42 to correlators 44. The correlators 44 are operable to correlate the receive signal 12. In one embodiment, the receive signal 12 includes a training sequence, and the training sequence is correlated.

Indications of the values of the correlations performed by the correlators 44 are provided to the controller 34 by way of lines 46. The controller 34 is operable to compare values of the indications provided thereto. Responsive to such comparisons, the controller 34 permits further processing of the receive signal 12 in a subset of the (m-n) remaining receiver branches 14. In one embodiment, the controller 34 prevents further processing of the receive signal 12 in o receiver branches 14 which exhibit the lowest correlation values. Thereby, further processing of the receive signal 12 is permitted in a second subset formed of (m-n-o) receiver branches 14. In another embodiment, the controller 34 prevents further processing of the receive signal 12 in receiver branches 14 in which the correlation values are less than a selected threshold.

To squelch further processing of the receive signal 12 in the o receiver branches 14, signals are generated by the controller 34 on lines 48 to the appropriate squelch elements 52 to squelch further processing of the receive signal 12 in the selected receiver branches 14.

Thereafter, the receive signal in the second subset of (m-n-o) receiver branches 14 are applied by way of lines 54 to demodulators 56. The demodulators 56 demodulate the receive signal 12 received thereat. Indications of the quality of the demodulation of the receive signal 12 are applied to the controller 34 by way of lines 58. In one embodiment, the indications of the demodulation quality are values generated by decoders forming portions of the demodulators 56.

The controller 34 is operable to compare the values of the indications of the demodulation qualities applied thereto. In one embodiment, the controller 34 permits continued processing of the receive signal 12 in only a third subset of (m-n-o-p) receiver branches 14. In one embodiment, the controller prevents further processing of the receive signal 12 in the receiver branches 14 which exhibit the lowest demodulation qualities. In another embodiment, the controller 34 prevents further processing of the receive signal 12 in receiver branches 14 in which the indications of the demodulation quality levels are less than a threshold level.

The controller 34 generates signals on lines 62 which are applied to squelch elements 64 to prevent further processing of the receive signal 12 in the p receiver branches 14. The receive signal 12 in the third subset of (m-n-o-p) receiver branches 14 is applied to the signal combiner 18 to be combined thereat. A combined signal generated by the combiner 18 is thereafter processed by additional receiver circuitry, not shown.

Squelching of further processing of the receive signal 12 received at the receiver branches 14 occurs subsequent to various stages of processing of the receive signal. If a determination is made that the signal quality of the receive signal 12 received at a selected receiver branch 14 is of low signal quality, further processing of the receive signal is squelched. Additional processing of the receive signal in such signal lines is thereby avoided. Reduction in processing required of a multi-branch receiver 10 is thereby possible.

Figure 2:
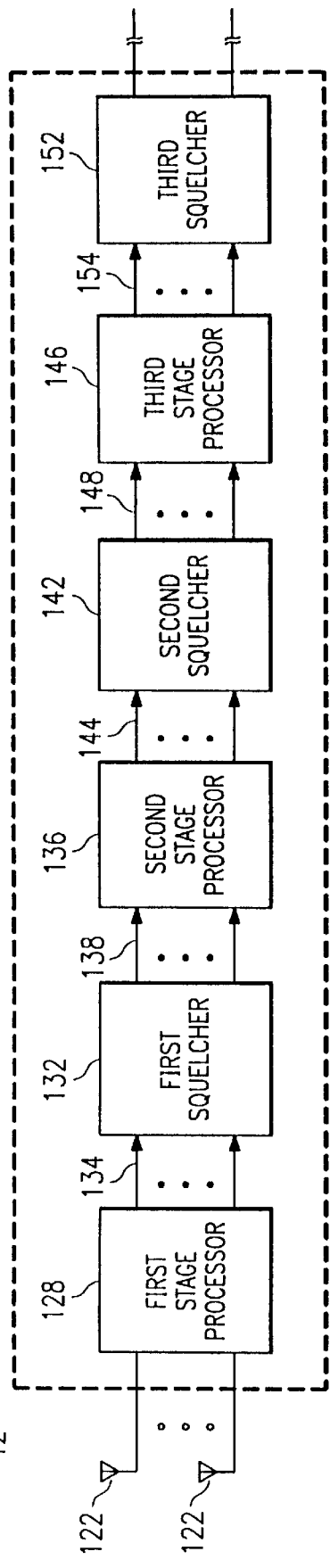
FIG. 2 illustrates a functional block diagram of a multi-branch receiver including another embodiment of the present invention as a portion thereof.

FIG. 2 illustrates a multi-branch receiver 100 in which an embodiment of the present invention is also operable. The receiver 100 also includes a plurality of m signal branches for receiving the receive signal 12. Each of the m receiver branches includes a transducer 122 for converting the electromagnetic energy of which the receive signal 12 is formed into electrical energy.

Sequences of the receive signal 12 are then applied to a first-stage processor 128. The first-stage processor 128 processes the sequences of the receive signal 12 detected by each of the transducers 122. First-stage processing is performed by the processor 128. Such processing, for instance, comprises measuring the signal strengths of the receive signals of the plurality of signal branches. Comparisons between the first-stage, processed values of the receive signal 12 received at the various receiver branches are compared by the first squelcher 132.

The first squelcher 132 is coupled to the first-stage processor 128 by way of lines 134. The first squelcher 132 compares values of the first-stage, processed signals. Responsive to such comparison, the squelcher 132 squelches further processing of the receive signal 12 on n receiver branches. The receive signal 12 received at a first subset of (m-n) receiver branches is provided to a second-stage processor 136 by way of lines 138.

The second-stage processor 136 processes the receive signals 12 of the first subset of (m-n) receiver branches. The second-stage processor 136, for example, correlates training sequences of the receive signal 12.

A second squelcher 142, coupled to the second-stage processor 136 by way of lines 144, receives indications of the second-stage, processed signals processed by the second-stage processor 136. Comparisons of values of such indications are made by the second squelcher 142. Responsive to such comparisons, the second squelcher 142 squelches further processing of the receive signal 12 in o receiver branches of the multi-branch receiver 100. The second squelcher 142 permits further processing of the receive signal 12 on a second subset of (m-n-o) branches of the multi-branch receiver 100.

The receive signal 12 received at the second subset of (m-n-o) receiver branches is applied to a third-stage processor 146 by way of lines 148. The third-stage processor 146 processes the receive signals applied thereto. In one embodiment, the third-stage processor 146 demodulates the receive signal 12 received on the second subset of receiver branches.

A third squelcher 152 is coupled to the third-stage processor 146 by way of lines 154. The third squelcher 152 compares the third-stage processed signals applied thereto and squelches further processing of the receive signal 12 on p receiver branches. Thereby, the third squelcher 152 permits further processing of a third subset of (m-n-o-p) receiver branches.

Not separately illustrated additional receiver-stage processors and squelchers can also form portions of the multi-branch receiver 100. Such additional processors and squelchers are further operable to gradually squelch processing of the receive signal 12 received on various receiver branches. As the processing of the receive signal 12 is squelched after various processing stages of the multi-stage receiver 100 instead of after complete processing of the receive signal 12 at each receiver branch, processing required to process the receive signal at the multi-branch receiver is reduced.

Figure 3:
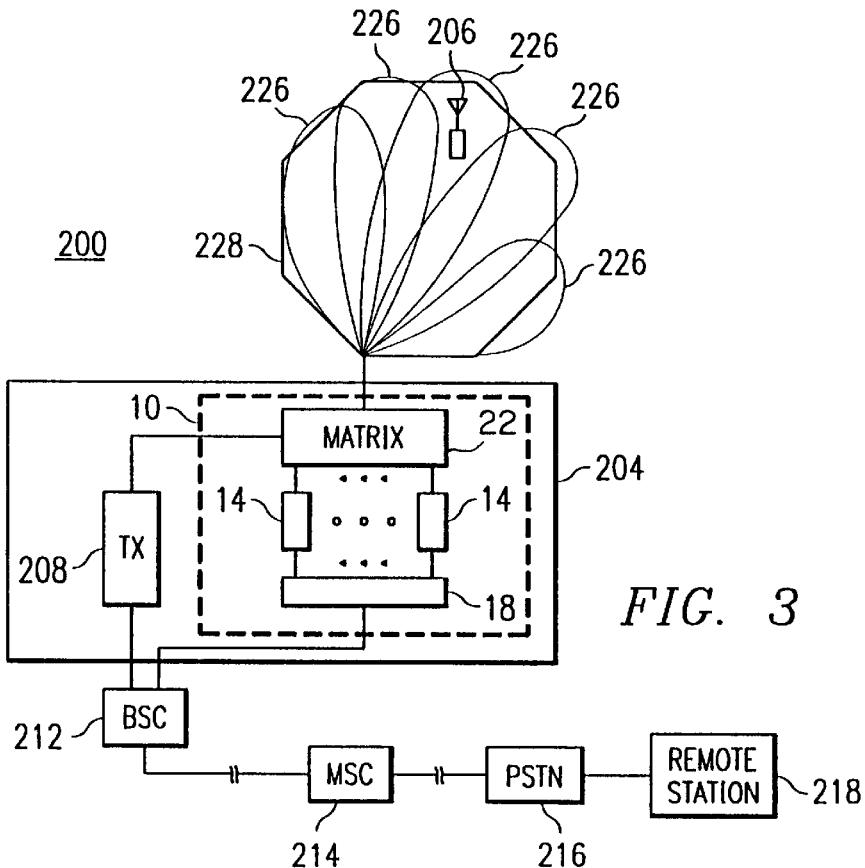
FIG. 3 illustrates a partial, functional block and partial schematic diagram of an embodiment of the present, invention operable in a cellular communication system.

FIG. 3 illustrates a cellular communication system 200 in which a multi-branch receiver 10 forms the portion. The multi-branch receiver 10 forms a portion of a base transceiver station 204. The base station 204 is operable to transceive communication signals with a remotely-positioned mobile subscriber unit 206.

Transmitter circuitry 208 of the base station 204 generates downlink signals that are transmitted to the mobile subscriber unit 206. And, the multi-branch receiver 10 is operable to receive uplink signals transmitted by the mobile subscriber unit 206.

The cellular communication system 200 is exemplary of a communication system constructed according to the specifications of a GSM (Global System for Mobile communications) system. The base station 204 is coupled to a base station controller (BSC) 212. The BSC 212 is coupled, in turn, to a mobile switching center (MSC) 214. And, in turn, the MSC 214 is coupled to a public switched telephone network (PSTN) 216. The PSTN 216 permits connection to a remote communication station 218.

In the exemplary embodiment of FIG. 3, the multi-branch receiver includes an antenna matrix 22 coupled to each of the receiver branches 14 of the multi-branch receiver. The antenna matrix 22, such as a Butler matrix, forms a plurality of antenna patterns 226. The antenna patterns 226 are selected such that the antenna coverage provided by such patterns encompasses a cell 228 defined by the base station 204.

When the mobile terminal 206 is positioned at a location in the cell 228, the receive signal 12 (FIG. 1) formed of an uplink transmission by the terminal 206 will be of better signal quality in some of the receiver branches 14 than in others of the receiver branches. As the receive signal 12 is processed in various receiver branches 14, determinations are made of the signal quality of the receive signal received in such signal branches. Further processing of the receive signal 12 is selectively squelched, as described above. Thereby, the amounts of processing required to process the receive signal 12 in the various receiver branches 14 is reduced.

Figure 4:
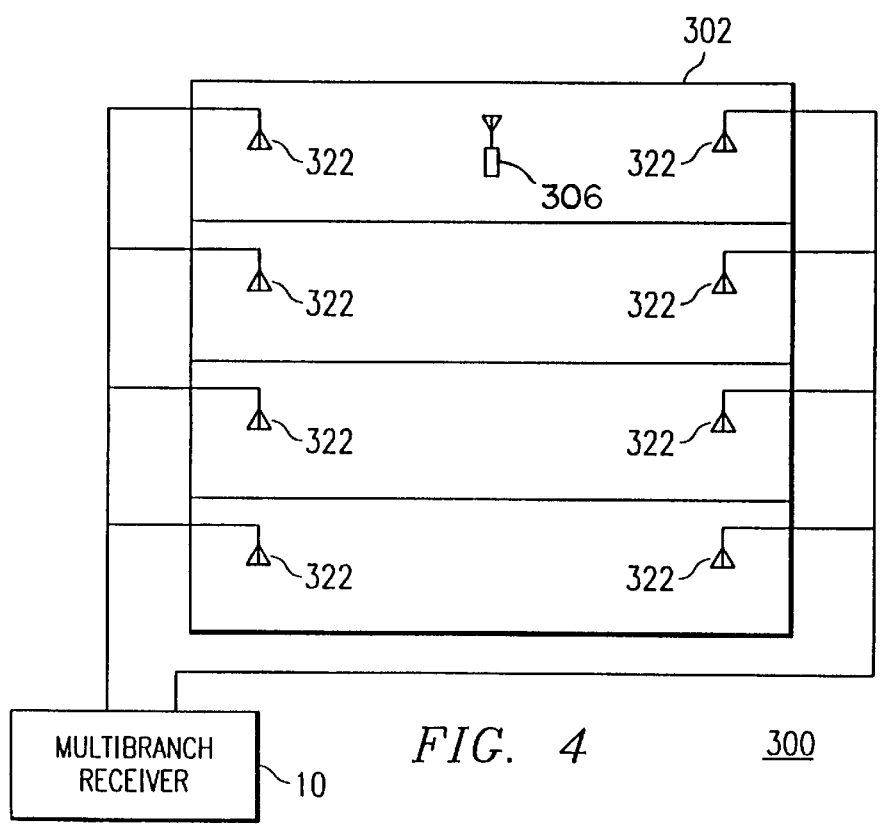
FIG. 4 illustrates a partial functional block, partial schematic diagram of a cordless telephone system in which an embodiment of the present invention is operable.

FIG. 4 illustrates a cordless telephone system 300 in which an embodiment of the present invention is operable. The cordless telephone system 300 is here illustrated to be constructed in a multi-story building structure 302. Antenna devices 322 are distributed upon the floors of the multi-story structure. A separate receiver branch (not shown) of the multi-branch receiver 10 is coupled to a separate antenna device 322. When uplink signals are transmitted by a mobile terminal 306 positioned within the building structure 302. The receive signal 12 is detected in certain of the receiver branches more strongly than in others of the receiver branches.

In the illustration of FIG. 4, the two antenna devices 322 positioned on the top floor of the building structure 302 are positioned to detect best the uplink signal generated by a mobile terminal 306 positioned upon the top floor of the building structure. Receiver branches to which the two antenna devices 322 positioned on the top floor are coupled exhibit the best signal characteristics. During operation of an embodiment of the present invention, as described above, the receive signals 12 applied on such two receiver branches are processed while processing of receive signals on the others of the receiver branches are squelched. Thereby, the advantages of utilization of a multi-branch receiver 10 are provided while reducing the amount of processing required to permit operation of the multi-branch receiver.

Figure 5:
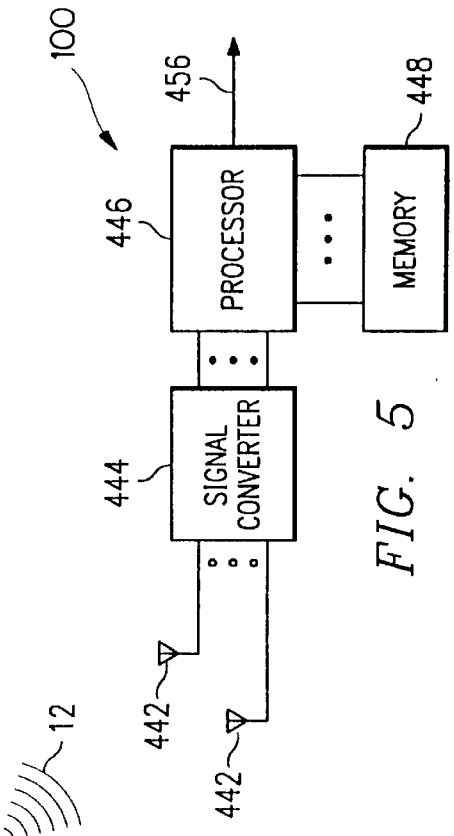
FIG. 5 illustrates a functional block diagram of a multi-branch receiver in which an embodiment of the present invention is operable.

FIG. 5 illustrates a multi-branch receiver 100, again having m signal branches for receiving the receive signal 12 at transducers 442 of the respective receiver branches. The transducers 442 convert the receive signal 12 into electrical form. The receive signals 12 are digitized, down-converted and synchronized by a signal converter 444.

Sequences of the receive signal 12 received at the respective receiver branches are provided to a processor 446 which stores the sequences in a memory element 448. The processor 446 thereafter selectively retrieves the stored sequences, thereby to permit the processing device to retrieve stored sequences of the receive signal 12. The processor 446 is operable to perform the processing, such as that described above with respect to the processors 128, 136, and 146, shown in FIG. 2. The processor 446 is further operable to perform the functions of the squelchers 132, 142, and 152. And, the processor 446 is further operable to combine the receive signal 12 of the selected receiver branches. Successive sequences of the receive signal 12 are processed by the processing device 446. And, during processing of each sequence of the receive signal 12, further processing of a sequence of the receive signal on selected receiver branches is selectively squelched, as described above. A combined signal is generated on the line 456 and is applied to other receiver circuitry (not shown).

Figure 6:
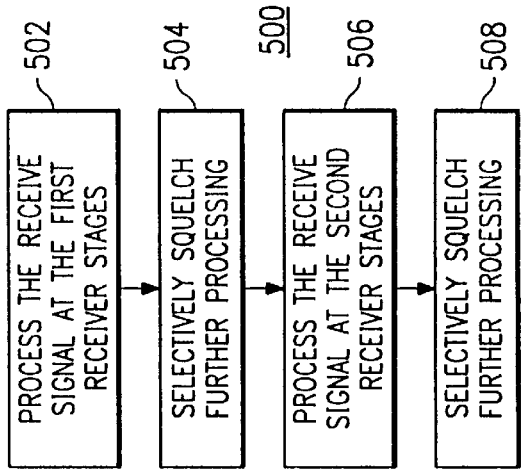
FIG. 6 illustrates a method flow diagram listing the method steps of the method of an embodiment of the present invention.

FIG. 6 illustrates a method, shown generally at 500, listing the method steps of the method of an embodiment of the present invention. The method 500 may, for example, be carried out by the processing device 446, shown in FIG. 5.

The method selectively squelches processing of the receive signal 12 at selected stages of selected ones of receiver branches of a multi-branch receiver 100. In one exemplary embodiment, the method 500 is operable in the base station 204 of the cellular communication system 200. In another embodiment, the method 500 is operable in the cordless telephone system 300. The method 500 is analogously operable in other communication systems.

First, and as indicated by the block 502, the receive signal 12 is processed at the first receiver stages of the receiver branches. Then, and as indicated by block 504, further processing of the receive signal 12 is selectively squelched in at least one receiver branch subsequent to processing thereof at the first receiver stage 502. Thereby, further processing of the receive signal 12 is permitted in a first subset of the receiver branches.

Then, and as indicated by the block 506, the receive signal 12 is processed at the second receiver stages of the first subset of the receiver branches. And, as indicated by the block 508, further processing of the receive signal 12 is selectively squelched in at least one additional receiver branch subsequent to processing thereof at the second receiver stage 506. Thereby, further processing of the receive signal 12 is permitted in a second subset of the receiver branches. The second subset forms a subset of the first subset of receiver branches.

Operation of the various embodiments of the present invention permits a reduction in the processing required of a multi-branch receiver to process a receive signal in the receiver branches of the receiver. Determinations are made of the signal qualities of the receive signal at various stages of processing in the receiver branches. When a determination is made that the receive signal received at a particular receiver branch is of poor quality, further processing of the receive signal in such branch is squelched.

Presently-preferred embodiments of the present invention have been described with a degree of particularity. The previous descriptions are of preferred examples for implementing the invention, and the scope of the invention should not necessarily be limited by this description. The scope of the present invention is defined by the following claims.

What is claimed is:

1. Apparatus in a multi-branch receiver device having a signal combiner selectively coupled to the receiver branches, each receiver branch of the receiver device for receiving a receive signal and each receiver branch having a first receiver stage, a second receiver stage, and a third receiver stage, said apparatus for selectively squelching processing of the receive signal at selected stages of selected ones of the receiver branches, said apparatus comprising:

a first squelch element positioned between the first receiver stage and the second receiver stage of at least selected ones of the receiver branches, each of said first squelch elements, when actuated, for squelching processing of the receive signal beyond the first receiver stage of the receiver branch at which said first squelch element is positioned;

a second squelch element positioned between the second receiver stage and the third receiver stage of at least selected ones of the receiver branches, each of said second squelch elements, when actuated, for squelching processing of the receive signal beyond the second receiver stage of the receiver branch at which said second squelch element is positioned;

a third squelch element positioned between the third receiver stage of the selected ones of the receiver branches and the signal combiner, each of said third squelch elements, when actuated, for squelching processing of the receive signal beyond the third receiver stage of the receiver branch at which said third squelch element is positioned; and a controller coupled to said first squelch elements, to said second squelch elements, and to said third squelch elements, said controller for receiving at least indications of operation of the first, second, and third receiver stages, respectively, of the receiver branches, said controller for selectively actuating said first squelch elements, said second squelch elements, and said third squelch elements responsive to reception of the at least indications of the operation of the first, second and third receiver stages.

2. The apparatus of claim 1 wherein the first receiver stages of the receiver branches of the multi-branch receiver comprise signal strength measurers for measuring signal strengths of the receive signal received at the receiver branches, wherein said controller receives indications of the signal strengths of the receive signal measured by the signal strength measurers, and wherein said controller compares values of the indications of the signal strengths measured by the signal strength measurers.

3. The apparatus of claim 2 wherein said controller selectively actuates said first squelch elements responsive to comparisons of the values of the indications of the signal strengths.

4. The apparatus of claim 2 wherein said controller actuates selected ones of said first squelch elements, thereby to permit further processing of the receive signal in only a first receiver-branch subset of the receiver branches.

5. The apparatus of claim 4 wherein the selected ones of said first squelch elements actuated by said controller are selected to exclude from further processing of the receive signal from at least one receiver branch having a signal strength measurer which provides indications of a smallest signal strength.

6. The apparatus of claim 4 wherein said controller actuates selected ones of said second squelch elements, thereby to permit further processing of the receive signal in only a second receiver-branch subset of the receiver branches, the second receiver-branch subset being a subset of the first receiver-branch subset.

7. The apparatus of claim 6 wherein the selected ones of said second squelch elements actuated by said controller are selected to exclude from further processing of the receive signal at least one receiver branch having a correlator which provides indications of a lowest level of correlation.

8. The apparatus of claim 1 wherein the second receiver stages of the receiver branches of the multi-branch receiver comprise correlators for correlating the receive signal received at the receiver branches, wherein said controller receives indications of levels of correlation correlated by the correlators, and wherein said controller compares values of the indications of the levels of correlation correlated by said correlators.

9. The apparatus of claim 8 wherein said controller selectively actuates said second squelch elements responsive to comparisons of the values of the indications of the correlations.

10. The apparatus of claim 1 wherein each third receiver stage comprises a demodulator for demodulating the receive signal, wherein said controller further receives indications of demodulator qualities of demodulations performed by each demodulator, and wherein said controller further compares values of the indications of the demodulator qualities provided thereto by each demodulator.

11. The apparatus of claim 10 wherein said controller selectively actuates said third squelch elements responsive to comparisons of the values of the indications of the demodulation qualities.

12. The apparatus of claim 10 wherein said controller actuates selected ones of said third squelch elements, thereby to permit application of the receive signal processed in only selected ones of the receiver branches whose third squelch elements are not actuated, to the signal combiner.

13. The apparatus of claim 12 wherein the selected ones of the third squelch elements actuated by said controller are selected to exclude from application to the signal combiner the receive signal processed by the selected ones of the receiver branches having values of demodulation qualities of lowest quality levels.

14. A method for receiving a receive signal at a multi-branch receiver, each branch of the multi-branch receiver having a first receiver stage, a second receiver stage, and a third receiver stage, said method for selectively squelching processing of the receive signal at selected stages of selected ones of the receiver branches by the steps of:

processing the receive signal at the first receiver stages of the receiver branches;

selectively squelching further processing of the receive signal subsequent to processing thereof at the first receiver stage, thereby to permit further processing of the receive signal in only a first subset of the receiver branches;

processing the receive signal at the second receiver stages of the first subset of the receiver branches;

selectively squelching further processing of the receive signal subsequent to processing thereof at the second receiver stage, thereby to permit further processing of the receive signal in only a second subset of the receiver branches, the second subset forming a subset of the first subset of receiver branches;

processing the receive signal at the third receiver stages of the second subset of the receiver branches; and selectively squelching further processing of the receive signal subsequent to processing thereof at the third receiver stage, thereby to permit further processing of the receive signal in only a third subset of the receiver branches, the third subset forming a subset of the second subset of receiver branches.

15. Apparatus in a multi-branch receiver device, each receiver branch of the receiver device for receiving a receive signal and each receiver branch having a first receiver stage, a second receiver stage, and a third receiver stage, said apparatus for selectively squelching processing of signals at selected stages of selected ones of the receiver branches, said apparatus comprising:

first receiver-stage processors for receiving the receive signal received at the receiver branches, said first receiver-stage processors for first-stage-processing of the receive signal received at the receiver branches;

first squelchers operative responsive to processing of the receive signal by said first receiver-stage processors, said first squelchers for selectively squelching further processing of the receive signal subsequent to processing thereof at the first receiver stage processors, thereby to permit further processing of the receive signal in only a first subset of the receiver branches;

second receiver-stage processors for receiving the receive signal from the first subset of receiver branches, once processed by said first receiver-stage processors, said second receiver-stage processors for second-stage processing of the receive signal received at the receiver branches;

second squelchers operative responsive to processing of the receive signal by said second receiver-stage processors, said second squelchers for selectively squelching further processing of the receive signal subsequent to processing thereof at the second receiver stage, thereby to permit further processing of the receive signal in only a second subset of the receiver branches, the second subset forming a subset of the first subset of receiver branches;

third receiver-stage processors for receiving the receive signal from the second subset of receiver branches, once processed by the second receiver-stare processors, said third receiver-stage processors for third-stage processing of the receive signal received at the receiver branches; and third squelchers operative responsive to processing of the receive signal by said third receiver-stage processors, said third squelchers for selectively squelching further processing of the receive signal subsequent to processing thereof at the third receiver stage, thereby to permit further processing of the receive signal in only a third subset of the receiver branches, the third subset forming a subset of the second subset of receiver branches.

16. The apparatus of claim 15 wherein each of said first receiver-stage processors comprises a processing device and a first signal-processing algorithm executable in said processing device and wherein each of said second receiver-stage processors comprises a second signal-processing algorithm executable in said processing device.

17. The apparatus of claim 16 wherein each of said first squelchers comprises a first squelch algorithm executable in said processing device and wherein each of said second squelchers comprises a second squelch algorithm executable in said processing device.

18. The apparatus of claim 15 wherein each of said first receiver-stage processors measures signal strength of the receive signal received at the receiver branches.

19. The apparatus of claim 18 wherein at least one of said first squelchers squelches further processing of the receive signal in at least the receiver branch having a signal strength, as measured by said first receiver-stage processor, of a smallest signal strength level.

20. The apparatus of claim 15 wherein said second receiver stage processors correlates the receive signal in the first subset of the receiver branches.

21. The apparatus of claim 20 wherein at least one of said second squelchers squelches further processing of the receive signal in at least the receiver branch of the first subset of receiver branches which exhibits a lowest level of correlation, determined by said second receiver stage processor.

22. The apparatus of claim 15 wherein each of said third receiver-stage processors comprises a processing device and a third signal-processing algorithm executable in said processing device and wherein each of said third squelchers comprises a third squelch algorithm executable in said processing device.

23. The apparatus of claim 15 wherein each of said third receiver-stage processors demodulates the receive signal in the second subset of the receiver branches.

24. The apparatus of claim 23 wherein at least one of said third squelchers squelches further processing of the receive signal in at least the receiver branch of the second subset of receiver branches which exhibits a demodulation quality of lowest quality level.

25. Apparatus in a multi-branch receiver device, each receiver branch of the receiver device for receiving a receive signal and each receiver branch having a first receiver stage, a second receiver stage, and at least a third receiver stage, said apparatus for selectively squelching processing the receive signal at selected stages of selected ones of the receiver branches, said apparatus comprising:

a first squelch element positioned between the first receiver stage and the second receiver stage of at least selected ones of the receiver branches, each of said first squelch elements, when actuated, for squelching processing of the receive signal beyond the first receiver stage of the receiver branch at which said first squelch element is positioned;

at least a second squelch element positioned between the second receiver stage and the at least third receiver stage of at least selected ones of the receiver branches, each of said at least second squelch elements, when actuated, for squelching processing of the receive signal beyond the second receiver stage of the receiver branch at which said second squelch element is positioned;

a controller coupled to said first squelch elements, to said second squelch elements, and to receive at least indications of operation of the first and second receiver stages, respectively, of the receiver branches, said controller for selectively actuating said first squelch elements and said second squelch elements responsive to reception of the at least indications of the operation of the first and second receiver stages;

said first receiver stages of the receiver branches of the multi-branch receiver comprise correlators for correlating the receive signal received at the receiver branches, wherein said controller receives indications of correlations performed by the correlators, and wherein said controller compares values of the correlations performed by the correlators; and said second receiver stages comprise demodulators for demodulating the receive signal received at the receiver branches and wherein said controller further receives indications of demodulation qualities of demodulations performed by the demodulators and compares values of the indications of the demodulation qualities provided thereto by the demodulators.

26. Apparatus in a multi-branch receiver device having a signal combiner selectively coupled to the receiver branches, each receiver branch of the receiver device for receiving a receive signal and each receiver branch having a first receiver stage and a second receiver stage, said apparatus for selectively squelching processing of the receive signal at selected stages of selected ones of the receiver branches, said apparatus comprising:

a first squelch element positioned between the first receiver stage and the second receiver stage of the selected ones of the receiver branches, each of said first squelch elements, when actuated, for squelching processing of the receive signal beyond the first receiver stage of the receiver branch at which said first squelch element is positioned;

a second squelch element positioned between the second receiver stage of the selected ones of the receiver branches and the signal combiner, each of the second squelch elements, when actuated, for squelching processing of the receive signal beyond the second receiver stage of the receiver branch at which said second squelch element is positioned;

each first receiver stage further includes a correlator for correlating the receive signal received at the receiver branches, wherein a controller receives indications of correlations performed by the correlators, and wherein said controller compares values of the correlations performed by the correlators;

each second receiver stage further includes demodulators for demodulating the receive signal received at the receiver branches and wherein said controller further receives indications of demodulation qualities of demodulations performed by the demodulators and compares values of the indications of the demodulation qualities provided thereto by the demodulators; and said controller coupled to said first squelch elements and said second squelch elements, said controller for receiving at least indications of operation of the correlators and demodulators of the receiver branches, said controller for selectively actuating said first squelch elements and said second squelch elements responsive to reception of the at least indications of the operation of the correlators and demodulators, where said signal combiner is coupled to outputs of the demodulators for combining the receive signal.

27. Apparatus in a multi-branch receiver device having a signal combiner selectively coupled to the receiver branches, each receiver branch of the receiver device for receiving a receive signal and each receiver branch having a first receiver stage, a second receiver stage, and at least a third receiver stage, said apparatus for selectively squelching processing of signals at selected stages of selected ones of the receiver branches, said apparatus comprising:

a first squelch element positioned between the first receiver stage and the second receiver stage of at least selected ones of the receiver branches, each of said first squelch elements, when actuated, for squelching processing of the receive signal beyond the first receiver stage of the receiver branch at which said first squelch element is positioned;

at least a second squelch element positioned between the second receiver stage and the at least third receiver stage of at least selected ones of the receiver branches, each of said at least second squelch elements, when actuated, for squelching processing of the receive signal beyond the second receiver stage of the receiver branch at which said second squelch element is positioned;

a controller coupled to said first squelch elements, to said at least second squelch elements, and to receive at least indications of operation of the first and second receiver stages, respectively, of the receiver branches, said controller for selectively actuating said first squelch elements and said second squelch elements responsive to reception of the at least indications of the operation of the first and second receiver stages;

said first receiver stages of the receiver branches of the multi-branch receiver comprise signal strength measurers for measuring signal strengths of the receive signal received at the receiver branches, wherein said controller receives indications of the signal strengths of the receive signal measured by the signal strength measurers, and wherein said controller compares values of the indications of the signal strengths measured by the signal strength measurers, and wherein said controller selectively actuates said first squelch elements responsive to comparisons of the values of the indications of the signal strengths to permit further processing of the receive signal in only a first receiver-branch subset of the receiver branches;

said second receiver stages of the receiver branches of the multi-branch receiver comprise correlators for correlating the receive signal received at the receiver branches, wherein said controller receives indications of levels of correlation correlated by the correlators, and wherein said controller compares values of the indications of the levels of correlation correlated by said correlators, and wherein said controller selectively actuates said second squelch elements responsive to comparisons of the values of the indications of the correlations to permit further processing of the receive signal in only a second receiver-branch subset of the receiver branches, the second receiver-branch subset being a subset of the first receiver-branch subset; and said signal combiner for combining the receive signal received and processed at the receiver branches, wherein the at least third receiver stages of the receiver branches comprise demodulators for demodulating the receive signal received at the receiver branches, and wherein said at least the second squelch element comprises a third squelch element positioned between the demodulator of the at least selected ones of the receiver branches and the signal combiner.

28. The apparatus of claim 27 wherein the third receiver stages of the receiver branches of the multi-branch receiver comprise demodulators for demodulating the receive signal received at the receiver branches, wherein said controller further receives indications of demodulators qualities of demodulations performed by the demodulators, and wherein said controller further compares values of the indications of the demodulation qualities provided thereto by the demodulation.

29. The apparatus of claim 28 wherein said controller selectively actuates said third squelch elements responsive to comparisons of the values of the indications of the demodulation qualities.

30. The apparatus of claim 29 wherein said controller actuates selected ones of said third squelch elements, thereby to permit application of the receive signal processed in only selected ones of the receiver branches whose third squelch elements are not actuated, to the signal combiner.

31. The apparatus of claim 30 wherein the selected ones of the third squelch elements actuated by said controller are selected to exclude from application to the signal combiner the receive signal processed by the selected ones of the receiver branches having values of demodulation qualities of lowest quality levels.

* * * * *

UNITED STATES PATENT AND TRADEMARK OFFICE
CERTIFICATE OF CORRECTION

PATENT NO. : 5,859,880
DATED : Jan. 12, 1999
INVENTOR(S) : Ljungberg et al.

It is certified that error appears in the above-identified patent and that said Letters Patent is hereby corrected as shown below:

Column 7, line 62     Replace "302."
                          With --302,--

Column 7, line 63     Replace "The"
                          With --the--

Column 11, line 53    Replace "receiver-stare"
                          With --receiver-stage--

Signed and Sealed this

Twentieth Day of July, 1999

Attest:

Q. TODD DICKINSON

*Attesting Officer*          *Acting Commissioner of Patents and Trademarks*